United States Patent [19]
Fujiie

[11] Patent Number: 5,981,936
[45] Date of Patent: Nov. 9, 1999

[54] PHOTO DETECTOR CIRCUIT HAVING A CURRENT MIRROR CIRCUIT

[75] Inventor: Kazuhiko Fujiie, Kanagawa, Japan

[73] Assignee: Sony Corporation, Tokyo, Japan

[21] Appl. No.: 09/037,439

[22] Filed: Mar. 10, 1998

[30] Foreign Application Priority Data

Mar. 14, 1997 [JP] Japan ................................. 9-061107

[51] Int. Cl.$^6$ .................................................. H01J 40/14
[52] U.S. Cl. ............................ 250/214 A; 250/214 LA; 369/44.29
[58] Field of Search ...................... 250/214 A, 214 LA, 250/201.5; 369/44.41, 44.29, 44.25, 116; 327/108

[56] References Cited

U.S. PATENT DOCUMENTS

| Re. 34,769 | 11/1994 | Yoshimoto et al. | ................ 250/214 A |
|---|---|---|---|
| 5,453,607 | 9/1995 | Ando et al. | ............................ 250/201.5 |
| 5,467,336 | 11/1995 | Ando et al. | ............................... 369/112 |
| 5,479,387 | 12/1995 | Ando et al. | ........................... 369/44.23 |
| 5,523,994 | 6/1996 | Ando et al. | ................................ 369/112 |
| 5,559,769 | 9/1996 | Ando et al. | ........................... 369/44.27 |

OTHER PUBLICATIONS

U.S. application No. 8/704,721, filed Jan 31, 1996.
U.S. application No. 9/129,266, filed Aug. 5,1998.
U.S. application No. 9/129,613, filed Aug. 5, 1998

Primary Examiner—Que T. Le
Attorney, Agent, or Firm—Limbach & Limbach L.L.P.

[57] ABSTRACT

A photo detector circuit comprises a photodiode for detecting a reflected light beam from an optical recording medium and converting the light beam to a current output, and a current-voltage converter for converting the output current of the photodiode to a proportional voltage. In this circuit, the output current of the photodiode is inputted via a current mirror circuit to the current-voltage converter, so that the S/N is improved and the entire circuit can be formed into a single chip to thereby decrease the number of external elements with another advantage of dimensional reduction.

7 Claims, 7 Drawing Sheets

PHOTO DETECTOR CIRCUIT HAVING A CURRENT MIRROR CIRCUIT

BACKGROUND OF THE INVENTION

1. Field of the Invention

The present invention relates to a photo detector circuit for use in a photodiode amplifier or the like for amplifying and outputting a light signal received by a photodiode for example.

2. Description of the Related Art

In a reproducing apparatus or a reproducing section of a recording/reproducing apparatus adapted to play an optical disk or a magneto-optical disk for example, there is performed an operation of generating a reproduced RF signal or a servo error signal for execution of tracking servo or focus servo control, on the basis of a light signal derived from a reflected laser beam received by a photo detector of an optical pickup. Normally the signal received by such a photo detector is supplied, after being amplified, to a predetermined function circuit in the following stage.

Figure 1:
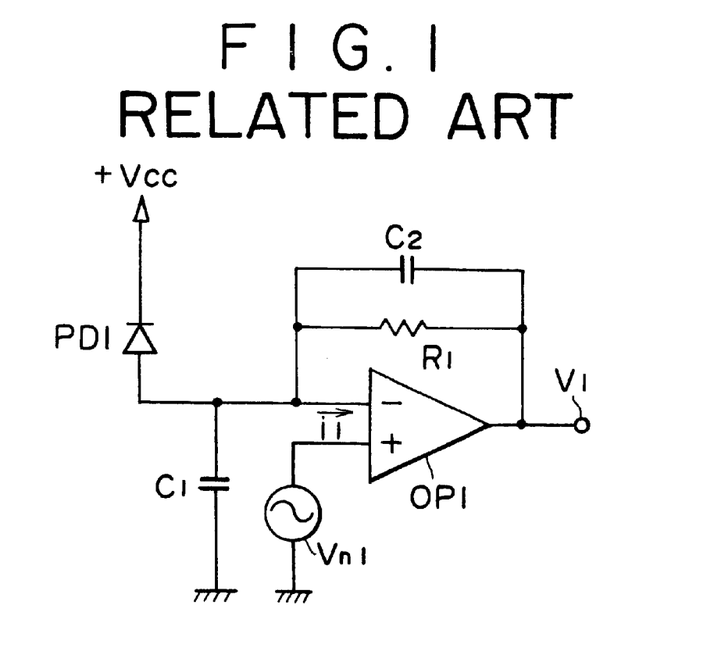
FIG. 1 shows a known current-voltage converter of the related art to perform photoelectric conversion.

FIG. 1 is a circuit diagram showing an exemplary photodiode amplifier circuit used to amplify a received light signal obtained by a photodiode which constitutes such a photo detector.

In this diagram, a photodiode PD1 serves as a photo detector, wherein its cathode is connected to a power supply line +Vcc, while its anode is connected to an inverting input of an operational amplifier OP1. It is supposed in this case that a stray capacitance $C_1$ is existent between the inverting input of the operational amplifier OP1 and the ground.

The operational amplifier OP1 converts the output current (received light signal) $i_1$ of the photodiode PD1 into a voltage proportional thereto and then amplifies the same. A resistor $R_1$ is connected between the inverting input of the operational amplifier OP1 and an output terminal. A capacitance denoted by reference numeral $C_2$ corresponds to a stray capacitance or a capacitor provided to flatten the frequency characteristic of the operational amplifier OP1 by suppressing the high-range peak in the frequency characteristic. Hereinafter the capacitance represented by $C_2$ will be regarded as a stray capacitance.

In this diagram, an input equated noise $v_{n1}$ to the operational amplifier OP1 is shown equivalently as it is inserted between a non-inverting input of the operational amplifier OP1 and the ground.

In the photodiode amplifier circuit of FIG. 1, when an output current $i_1$ of the photodiode PD1 is obtained, the output voltage $v_1$ of the operational amplifier OP1 is expressed as follows in a frequency range where the effects of stray capacitances $C_1$ and $C_2$ are merely slight.

$$v_1 = -i_1 \cdot R_1 + v_{n1} \tag{1}$$

Figure 2:
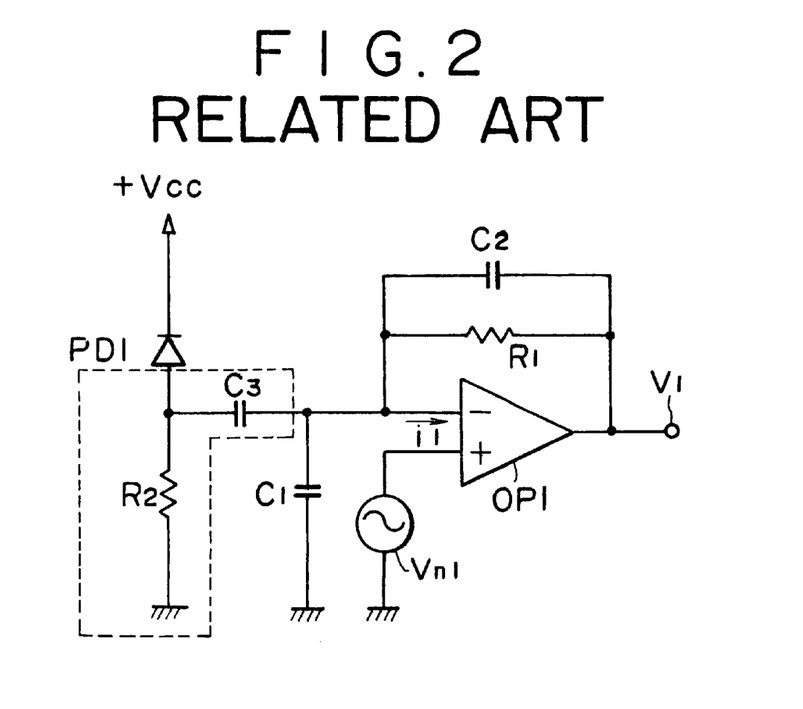
FIG. 2 shows another known current-voltage converter of the related art to perform photoelectric conversion.

FIG. 2 shows a structural example of another photodiode amplifier circuit. The configuration of the photodiode amplifier circuit shown in this diagram is formed by modifying the photodiode amplifier circuit of FIG. 1 into AC coupling type. Since any circuit elements corresponding to those in FIG. 1 are denoted by like reference numerals or symbols, a repeated explanation thereof is omitted. The difference between the two circuits of FIGS. 1 and 2 resides in a portion enclosed with a one-dot chained line.

The configuration of the photodiode amplifier circuit shown in FIG. 2 is constituted by adding a resistor $R_2$ and a DC blocking capacitor $C_3$ to the circuit of FIG. 1. The resistor $R_2$ is inserted between the anode of the photodiode PD1 and the ground, and the DC blocking capacitor $C_3$ is inserted between the anode of the photodiode PD1 and the inverting input. In this case, therefore, only an AC component alone is supplied as the output current $i_1$ of the photodiode PD1 to the inverting input of the operational amplifier OP.

In this case, if the resistor $R_2$ and the DC blocking capacitor $C_3$ are so set as to be sufficiently greater than the other resistor ($R_1$) and capacitances (stray capacitances $C_1$ and $C_2$), then it follows therefrom that the output voltage $v_1$ expressed by Eq. (1) can be obtained, in the predetermined signal band, from the operational amplifier OP1 as in the aforementioned photodiode amplifier circuit of FIG. 1.

In playing a magneto-optical disk for example, it is generally customary that, although a detailed explanation is omitted here, a differential detection output relative to the received light signals of two photo detectors is obtained for reproduction of RF signals by reading out from the disk the data recorded in the form of magnetic pits.

Figure 3:
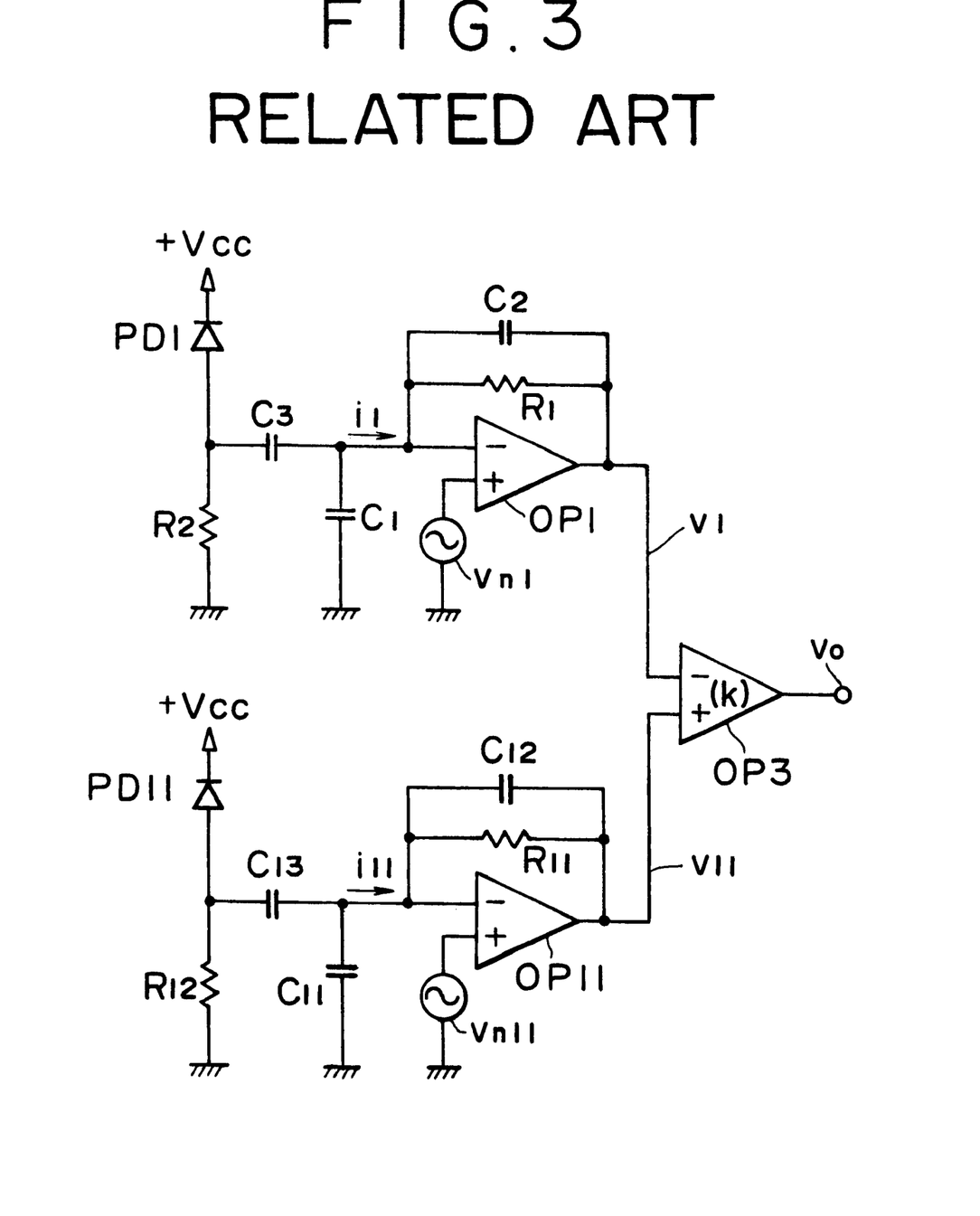
FIG. 3 shows a further known current-voltage converter of the related art to perform photoelectric conversion.

FIG. 3 is a circuit diagram of a photodiode amplifier circuit which is employable as a differential detector circuit to execute differential detection with respect to the received light signals of two photo detectors. Any circuit elements corresponding to those in FIG. 2 are denoted by like reference numerals or symbols, and a repeated explanation thereof is omitted.

In this case, the above-described two photo detectors correspond to photodiodes PD1 and PD11.

Since the amplifier circuit in FIG. 3 for amplifying the output current $i_1$ of the photodiode PD1 is structurally the same as that of FIG. 2, any circuit elements corresponding to those in FIG. 2 are denoted by like reference numerals or symbols, and a repeated explanation thereof is omitted.

Meanwhile another amplifier circuit for amplifying the output current (received light signal) $i_{11}$ of the photodiode PD11 comprises an operational amplifier OP1, resistors $R_{11}$ and $R_{12}$, stray capacitances $C_{11}$ and $C_{12}$, a DC blocking capacitor $C_{13}$, and an input equated noise $v_{n11}$. In this circuit, the connection of the component elements is the same as that in the amplifier circuit which comprises an operational amplifier OP1, resistors $R_1$ and $R_2$, stray capacitances $C_1$ and $C_2$, a DC blocking capacitor $C_3$, and an input equated noise $v_{n1}$ for amplifying the output current (received light signal) $i_1$ of the photodiode PD1.

The output voltage $v_1$ of the operational amplifier OP1 is supplied to an inverting input of a differential amplifier OP3, while the output voltage $v_{11}$ of the operational amplifier OP11 is supplied to a non-inverting input of the differential amplifier OP3. The differential amplifier OP3 is supposed to have an amplification factor k.

In the above circuit configuration, the output voltage $v_1$ of the operational amplifier OP1 becomes the same as the one expressed by Eq. (1) when the values of the resistors $R_2$, $R_{12}$ and the DC blocking capacitors $C_3$, $C_{13}$ are sufficiently greater than those of the other capacitors C and resistors R and in a frequency range where the influences of the stray capacitances $C_1$, $C_2$, $C_{11}$, $C_{12}$ are merely slight. Meanwhile the output voltage $v_{11}$ of the operational amplifier OP11 is expressed as follows in accordance with Eq. (1).

$$v_{11} = -i_{11} \cdot R_{11} + v_{n11} \tag{2}$$

The differential amplifier OP3 produces its differential output voltage $v_0$ which represents the difference between the output voltage $v_1$ of the operational amplifier OP1 and the output voltage $v_{11}$ of the operational amplifier OP11. This differential output voltage $v_0$ is expressed as $$v_0 = k(v_{11} - v_1) \tag{3}$$

Supposing now that the circuit shown in FIG. 3 for example is a differential detection circuit of a photo detector adapted for a magneto-optical disk, it is considered that the resistors $R_1$, $R_{11}$, the amplification factor k and the output currents $i_1$, $i_{11}$ mutually have the following relationship.

$$R_1=R_{11}=R$$

$$k=1$$

$$i_1=-i_{11}=i \tag{4}$$

Further, input equated noises $v_{n1}$ and $v_{n11}$ from random generation sources can be simplified as $$v_{n11}=v_{n1}=\sqrt{2}v_n \tag{5}$$

Therefore, the differential output voltage $v_0$ obtained from the differential amplifier OP3 in this case can be expressed as $$v_0=2i\cdot R+\sqrt{2}v_n \tag{6}$$

In any of the photodiode amplifier circuits described above with reference to FIGS. 1 to 3, the received light signal of each photodiode is weak, and consequently a satisfactory S/N (signal-to-noise ratio) is required to ensure high-reliability data reproduction.

In case the input equated noise $v_{n1}$ or $v_{n11}$ to the operational amplifier is dominant over the S/N of the photodiode amplifier circuit, the S/N can be improved by increasing the value of the resistor $R_1$ or $R_{11}$ connected to the operational amplifier. However, since the output band width $f_z$ of the operational amplifier is decided as $$f_z=1/(2\sqrt{\cdot}C_2\cdot R_1) \tag{7}$$

there arises a problem that the band width is narrowed with an increase of the value of the resistor $R_1$ or $R_{11}$. Since the stray capacitance $C_2$ acts to flatten the frequency characteristic, a limit is existent in decreasing the value thereof. Accordingly, improvement of the S/N by increasing the value of the resistor $R_1$ or $R_{11}$ to maintain a sufficient band width is somewhat restricted, and this means is not considered to be effective.

Figure 4:
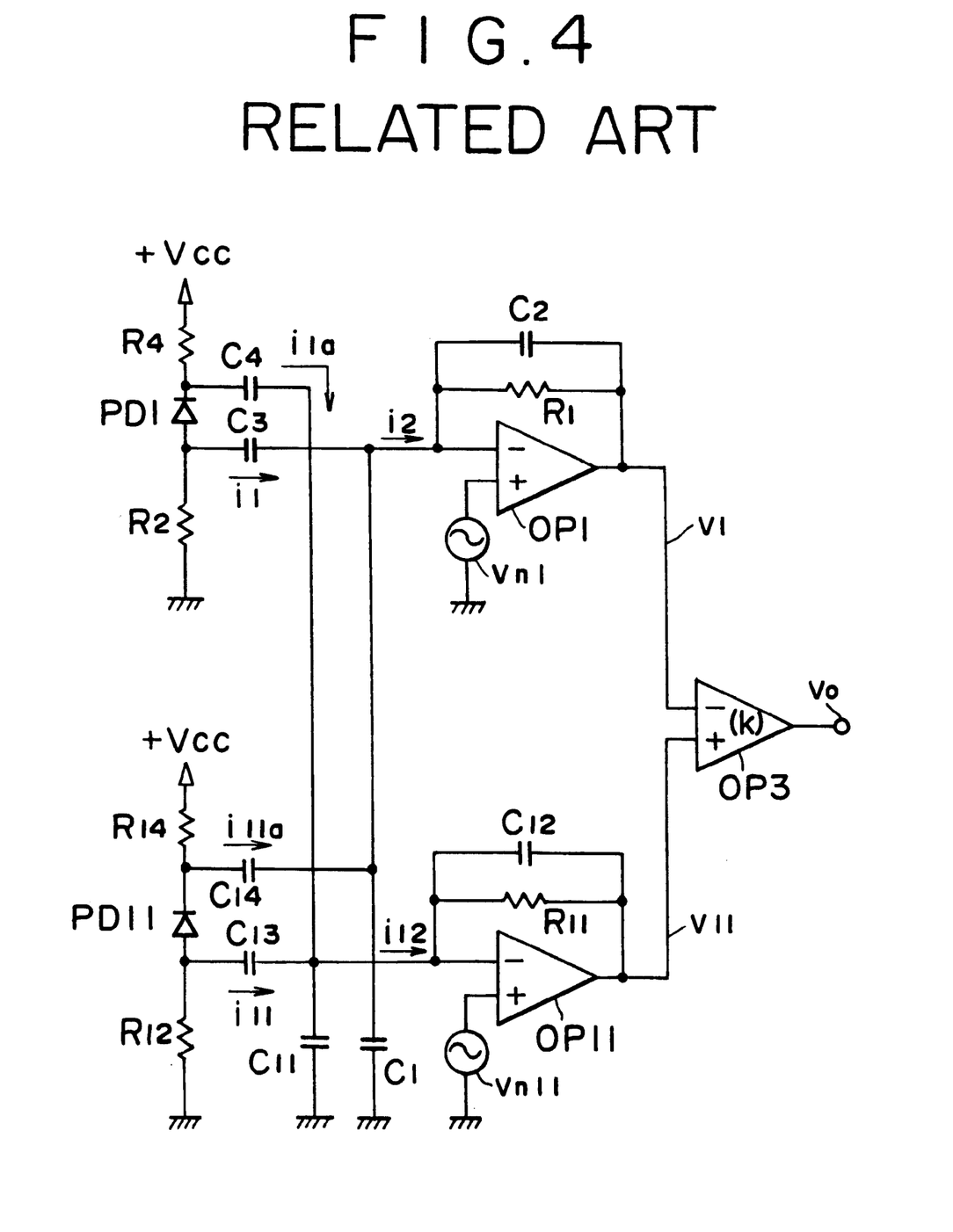
FIG. 4 shows a still further known current-voltage converter of the related art to perform photoelectric conversion.

In order to solve the above problem, there is proposed, by the present applicant, a photodiode amplifier circuit having a configuration of FIG. 4, as exemplified in U.S. application Ser. No. 08/704721 filed on Jan. 31, 1996. The photodiode amplifier circuit of FIG. 4 also is structurally a differential detection circuit which performs differential detection with respect to received light signals of two photo detectors, similarly to the aforementioned amplifier circuit of FIG. 3. Any circuit elements corresponding to those in FIG. 3 are denoted by like reference numerals or symbols, and a repeated explanation thereof is omitted.

In the photodiode amplifier circuit of FIG. 4, a resistor $R_4$ is inserted in series between a photodiode PD1 and a power supply line +Vcc, and similarly a resistor $R_{14}$ is inserted in series between a photodiode PD11 and a power supply line +Vcc. Further a DC blocking capacitor $C_4$ is inserted between a junction of the resistor $R_4$ and the cathode of the photodiode PD1, and an inverting input of an operational amplifier OP11. Similarly, a DC blocking capacitor $C_{14}$ is inserted between a junction of the resistor $R_{14}$ and the cathode of the photodiode PD11, and an inverting input of an operational amplifier OP1.

In such a circuit configuration, output currents $i_1$ and $i_{1a}$, which are equal in quantity but opposite in phase to each other, can be obtained from the anode and cathode of the photodiode PD1. Similarly, output currents $i_{11}$ and $i_{11a}$, which are equal in quantity but opposite in phase to each other, can be obtained from the anode and cathode of the photodiode PD11.

When the values of the resistors $R_2$, $R_{12}$, $R_4$, $R_{14}$ and the DC blocking capacitors $C_3$, $C_4$, $C_{13}$, $C_{14}$ are sufficiently greater than those of the other capacitances C and resistors R and in a frequency range where the influences of the stray capacitances $C_1$, $C_2$, $C_{11}$, $C_{12}$ are merely slight, the output voltage $v_1$ of the operational amplifier OP1 is obtained by amplifying, as expressed in Eq. (8) below, the current $i_2$ produced through addition of the output currents $i_1$ and $i_{11a}$ which are delivered respectively from the photodiodes PD1 and PD11 and have an in-phase relationship mutually.

$$v_1=-i_2\cdot R_1+v_{n1}$$

$$i_2=i_1+i_{11a} \tag{8}$$

Similarly, the output voltage $v_{11}$ of the operational amplifier OP11 is obtained by amplifying, as expressed in Eq. (9) below, the current $i_{12}$ produced through addition of the output currents $i_{11}$ and $i_{1a}$ which are delivered from the photodiodes PD11 and PD1 respectively and have an in-phase relationship mutually.

$$v_{11}=-i_{12}\cdot R_{11}+v_{n11}$$

$$i_{12}=i_{11}+i_{1a} \tag{9}$$

Further, the output voltage $v_0$ of the differential amplifier OP3, to which the output voltages $v_1$ and $v_{11}$ of the operational amplifiers OP1 and OP11 are supplied, is expressed as $$v_0=k(v_{11}-v_1) \tag{10}$$

Assuming that the circuit shown in FIG. 4 is a differential detection circuit of photo detectors adapted for a magneto-optical disk, the resistors $R_1$, $R_{11}$, amplification factor k and output currents $i_{11}$, $i_{1a}$, $i_{11}$, $i_{11a}$ can be simplified as $$R_1=R_{11}=R$$

$$k=1$$

$$i_1=-i_{1a}=-i_{11}=i_{11a}=i \tag{11}$$

Further the input equated noises $v_{n1}$ and $v_{n11}$, which are random generation sources, can be simplified as Eq. (5) mentioned already. Therefore, the output voltage $v_0$ of the differential amplifier OP3 in this case is expressed as $$v_0=4i\cdot R+\sqrt{2}v_n \tag{12}$$

Comparing the output voltage $v_0$ (Eq. (12)) of the differential amplifier OP3 in the photodiode amplifier circuit of FIG. 4 with the output voltage $v_0$ (Eq. (6)) of the differential amplifier OP3 in the photodiode amplifier circuit of FIG. 3, the signal output obtained in the circuit of FIG. 4 is twice on condition that the noise components included in the output voltages $v_0$ of the two differential amplifiers OP3 are equal to each other, so that the S/N is also improved twice as compared with the circuit of FIG. 3.

In manufacture of a photo detector, it is generally customary that, regarding a physical structure of semiconductor, at least cathodes of a predetermined number of photodiodes constituting a desired photo detector are formed to be mutually common.

However, in the photodiode amplifier circuit of FIG. 4 for example, the resistors $R_4$ and $R_{14}$ need to be connected respectively to the cathodes of the photodiodes PD1 and PD11, whereby at least two of the plural photodiodes of the photo detector corresponding to PD1 and PD11 should be so formed that the anodes and cathodes thereof are mutually independent.

Also in the photodiode amplifier circuit of FIG. 4, it is necessary to extract the received light signals, which are AC components, from the photodiodes PD1 and PD11 via the DC blocking capacitors $C_3$, $C_{13}$, $C_4$, $C_{14}$, so that the amplifier circuit configuration is limited only to an AC coupling type, and amplification of DC signal is impossible.

Further, in any of the photodiode amplifier circuits described heretofore, it is preferred that the whole structure be shaped into a single chip with dimensional reduction. However, since the capacitance values of the DC blocking capacitors $C_3$, $C_4$, $C_{13}$, $C_{14}$ and the resistance values of the resistors $R_2$, $R_4$, $R_{12}$, $R_{14}$ are great in the circuit of FIG. 4, it is difficult to construct the whole structure into a single chip inclusive of such component elements.

SUMMARY OF THE INVENTION

It is therefore an object of the present invention to provide an improved photodiode amplifier circuit with an enhanced S/N while ensuring a sufficient output voltage band width, wherein at least cathodes of photodiodes are formed to be mutually common, and the photodiode amplifier circuit combined with amplification of DC signal components can be constructed into a single chip.

According to one aspect of the present invention, there is provided a photo detector for use in a photodiode amplifier circuit which comprises a photodiode; a current-voltage converter/amplifier means for converting the output current of the photodiode and then amplifying the converted current; and a current mirror for transferring at least the output current of the photodiode to the current-voltage converter/amplifier means. In this circuit configuration, the current mirror is capable of amplifying the output current of the photodiode and transferring the same.

Due to such configuration, it becomes possible to input to the current-voltage converter/amplifier means the received light signal of the photodiode after amplifying the same with a current amplification factor determined by, e.g., the emitter area ratio of the current mirror.

The above and other features and advantages of the present invention will become apparent from the following description which will be given with reference to the illustrative accompanying drawings.

DESCRIPTION OF THE PREFERRED EMBODIMENTS

Hereinafter a description will be given on a photodiode amplifier circuit represented by some preferred embodiments of the present invention. It is supposed that the photodiode amplifier circuit in each of the embodiments is provided for a photo detector which is employed in a reproducing section of a recording/reproducing apparatus to play a magneto-optical disk for example.

Figure 5:
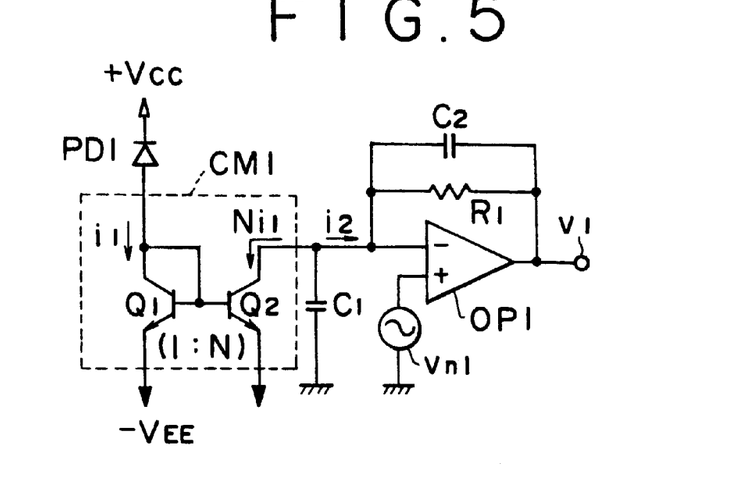
FIG. 5 shows a first embodiment of a current-voltage converter applicable to the present invention to perform photoelectric conversion.

FIG. 5 is a circuit diagram showing the configuration of a first embodiment which represents a photodiode amplifier circuit of the invention. In this diagram, a photodiode PD1 constitutes a photo detector, wherein a power supply line +Vcc is connected to a cathode of the photodiode PD1, and a current mirror CM1 is connected to an anode thereof.

The current mirror CM1 has transistors $Q_1$ and $Q_2$, wherein the anode of the photodiode PD1 is connected to a base and a collector of the transistor $Q_1$, and an emitter thereof is connected to a power supply line $V_{EE}$. A base of the transistor $Q_2$ on the transfer output side is connected to the base of the transistor $Q_1$, while a collector of the transistor $Q_2$ is connected to an inverting input of an operational amplifier OP1. And an emitter of the transistor $Q_2$ is connected to a power supply line $-V_{EE}$.

The ratio of the emitter area of the transistor $Q_1$ to the emitter area of the transistor $Q_2$ is set to 1:N (N>1). Consequently, when an output current $i_1$ of the photodiode PD1 flows in the transistor $Q_1$, it follows therefrom that a corrector current $Ni_1$, which is greater N times correspondingly to the emitter area ratio N, flows in the transistor $Q_2$. Thus, the emitter area ratio N in this embodiment can be regarded as a current amplification factor relative to the output current of the photodiode.

In this diagram, the collector current $Ni_1$ and the input current $i_2$ to the operational amplifier OP1 are practically the same with mere difference of the polarity, and the following relationship is existent therebetween.

$$i_2 = -N \cdot i_1 \qquad (13)$$

The operational amplifier OP1 converts the output current $i_2$ of the photodiode PD1, which has been amplified N times by the current mirror CM1, into a proportional voltage and then amplifies the same.

A resistor $R_1$ is connected between an inverting input of the operational amplifier OP1 and an output terminal thereof. A capacitance denoted by reference numeral $C_2$ corresponds to a stray capacitance or a capacitor provided to flatten the frequency characteristic of the operational amplifier OP1 by suppressing the high-range peak in the frequency characteristic. In this embodiment also, the capacitance denoted by $C_2$ will be regarded as a stray capacitance.

In this diagram, an input equated noise $v_{n1}$ to the operational amplifier OP1 is shown equivalently as it is inserted between a non-inverting input of the operational amplifier OP1 and the ground, and a stray capacitance existing between the inverting input of the operational amplifier OP1 and the ground is shown equivalently as $C_1$.

In the photodiode amplifier circuit of FIG. 5, the output voltage $v_1$ of the operational amplifier OP1 is expressed as follows in a frequency range where the influences of stray capacitances $C_1$ and $C_2$ are merely slight.

$$v_1 = -i_2 \cdot R_1 + v_{n1} = N \cdot i_1 \cdot R_1 + v_{n1} \quad (14)$$

In this embodiment, the output current of the photodiode PD1 is inputted to the operational amplifier OP1 after being amplified N times by the current mirror CM11. Therefore, in comparing the output voltage $v_1$ of the operational amplifier OP1 of FIG. 5 with the aforementioned output voltage $v_1$ (Eq. (1)) of the operational amplifier OP1 of FIG. 1 shown as an example of the related art, it becomes possible to amplify only the signal component N times on condition that the level of the noise component, i.e., input equated noise $v_{n1}$, remains unchanged, hence improving the S/N correspondingly.

More specifically, when the emitter area ratio N of the two transistors $Q_1$ and $Q_2$ is set to 2, the output voltage $v_1$ of the operational amplifier OP1 is expressed as $$v_1 = 2i_1 \cdot R_1 + v_{n1} \quad (15)$$

Consequently, on condition that the noise component or the input equated noise $v_{n1}$ remains unchanged, the output signal voltage of the operational amplifier OP1 can be increased twice.

Since the desired gain of the output signal voltage is obtained in this manner due to the emitter area ratio N in the current mirror CM1, it is not particularly necessary to increase the value of, e.g., the resistor $R_1$ for enhancing the S/N, hence avoiding the disadvantage that the frequency band of the output voltage determined according to Eq. (7) is narrowed.

It is known that, although the S/N can be improved with a rise of the emitter area ratio N of the transistors $Q_1$ and $Q_2$, the stray capacitance $C_1$ is also increased therewith to eventually cause an increase of the output noise in a range higher than the frequency f1 which is determined by Eq. (16) as given below.

$$f1 = 1/(2\sqrt{\cdot} C_1 \cdot R_1) \quad (16)$$

In the photodiode amplifier circuit of FIG. 5, no resistor is existent to be connected to the photodiode PD1 for example, so that the entire circuit configuration in this diagram can easily be formed into a single chip with the exception of PD1 or inclusively of the same. And it becomes possible to suppress increase of the stray capacitance $C_1$ by forming the circuit into a single chip.

Therefore, when the circuit configuration shown in FIG. 5 is formed partially or entirely into a single chip, the S/N can be widely improved by setting the emitter area ratio N to a greater value.

Figure 9:
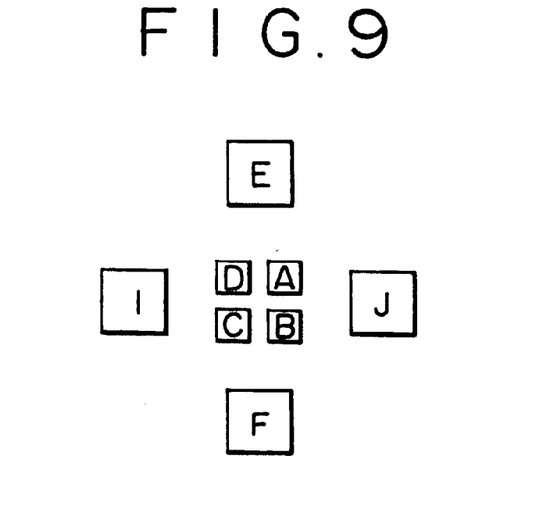
FIG. 9 shows a pattern of a photo detector applicable to a magneto-optical recording/reproducing apparatus.

To perform reproduction of data from a magneto-optical disk for example, photo detectors of a structure shown in FIG. 9 are provided. There are eight photo detectors A, B, C, D, E, F, I and J in this diagram, wherein received light signals of the four photo detectors A, B, C and D are used for focus servo control, while received light signals of the two photo detectors E and F are used for t racking servo control. And the two photo detectors I and J are used to reproduce RF signalsout of the received light signals obtained as pit data from the disk. Although a detailed explanation thereof is omitted here, RF signals are reproduced through differential detection executed relative to the received light signals of the photo detectors I and J.

Figure 6:
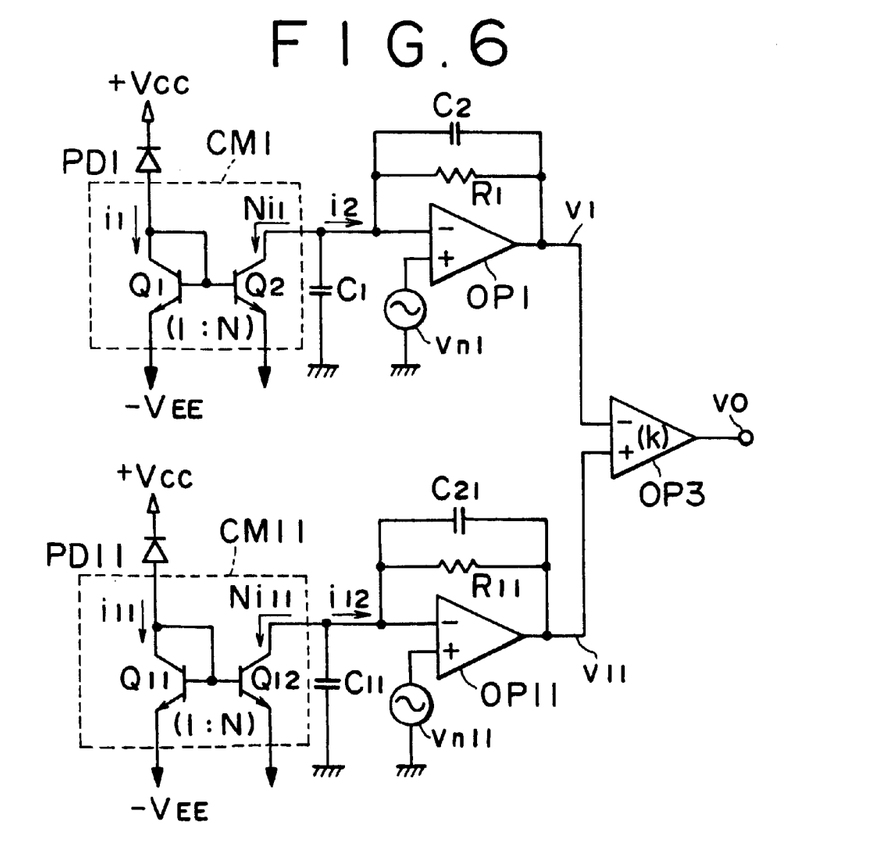
FIG. 6 shows a second embodiment of a current-voltage converter applicable to the invention to perform photoelectric conversion.

FIG. 6 is a circuit diagram showing a second embodiment of this invention which represents a photodiode amplifier circuit employable as a differential detection circuit to execute differential detection relative to the received light signals of the photo detectors I and J. Any circuit elements corresponding to those in FIG. 5 are denoted by like reference numerals or symbols, and a repeated explanation thereof is omitted.

In this case, the photo detectors I and J for example correspond to photodiodes PD1 and PD11, respectively.

An amplifier circuit, which supplies the output current $i_1$ of the photodiode PD1 to an operational amplifier OP1 via a current mirror CM1, then converts the current into a proportional voltage and amplifies such a voltage, is structurally the same as the circuit of FIG. 5. Therefore, any circuit elements corresponding to those in FIG. 5 are denoted by like reference numerals or symbols, and a repeated explanation thereof is omitted.

Another amplifier circuit for converting the output current $i_{11}$ of the photodiode PD11 into a proportional voltage and amplifying the same comprises a current mirror CM11 (transistors $Q_{11}$, $Q_{12}$), an operational amplifier OP11, a resistor $R_{11}$, stray capacitances $C_{11}$, $C_{12}$, and an input equated noise $v_{n11}$. These circuit elements are connected in the same manner as the connection of a current mirror CM1 (transistors $Q_1$, $Q_2$), an operational amplifier OP1, a resistor $R_1$, stray capacitances $C_1$, $C_2$, and an input equated noise $v_{n1}$ which constitute the amplifier circuit for converting the output current $i_1$ of the photodiode PD1 into a proportional voltage and then amplifying such a voltage.

It is assumed in this embodiment that the emitter area of the transistor $Q_{11}$ and that of the transistor $Q_{12}$ are set to 1:N, and similarly the emitter area ratio of the transistors $Q_1$ and $Q_2$ is set to N.

The output current $i_1$ of the photodiode PD1 is amplified N times by the current mirror CM1 to a current $i_2$ ($=-Ni_1$), which is subsequently converted and amplified by the operational amplifier OP1 to an output voltage $v_{11}$. Meanwhile the output current $i_{11}$ of the photodiode PD11 is amplified N times by the current mirror CM11 to a current $i_{12}$ ($=-Ni_{11}$), which is subsequently converted and amplified by the operational amplifier OP11 to an output voltage $v_{11}$.

The output voltage $v_1$ of the operational amplifier OP1 is supplied to an inverting input of a differential amplifier OP3, while the output voltage $v_{11}$ of the operational amplifier OP11 is supplied to a non-inverting input of the differential amplifier OP3. It is supposed here that the differential amplifier OP3 has an amplification factor k.

In the photodiode amplifier circuit of such a configuration, the output voltage $v_0$ of the differential amplifier OP3 is expressed as follows in a frequency range where the influences of the stray capacities $C_1$, $C_2$, $C_{11}$, $C_{12}$ are merely slight.

$$v_0 = k(v_{11} - v_1)$$
$$v_{11} = -i_{12} \cdot R_{11} + v_{n11} = N \cdot i_{11} \cdot R_{11} + v_{n11}$$
$$v_1 = -i_2 \cdot R_1 + v_{n1} = N \cdot i_1 \cdot R_1 + v_{n1} \quad (17)$$

Since the circuit shown in FIG. 6 is a differential detection circuit consisting of photo detectors I and J adapted for a magneto-optical disk, the resistances $R_1$, $R_{11}$ and the amplification factor k can be simplified as $$R_1 = R_{11} = R$$

$$k = 1 \quad (18)$$

Supposing that the output currents $i_1$ and $i_{11}$ of the photodiodes PD1 and PD11 are each composed of DC component I and AC component i, the output currents $i_1$ and $i_{11}$ can be treated as $$i_1 = I + i, \; i_{11} = I - i \quad (19)$$

The input equated noises $v_{n1}$ and $v_{n11}$, which are random generation sources, can be simplified as Eq. (5) given before. Therefore, the output voltage $v_0$ of the differential amplifier OP3 according to Eq. (17) can be expressed as $$v_0 = -2N \cdot i \cdot R + \sqrt{2} v_n \quad (20)$$

Consequently, comparing the photodiode amplifier circuit of the embodiment in FIG. 6 with the aforementioned photodiode amplifier circuit of the related art in FIG. 3, it is found that, as obvious from Eq. (6), the S/N relative to the output voltage $v_0$ of the differential amplifier OP3 in the photodiode amplifier circuit of FIG. 3 can be improved N times in the photodiode amplifier circuit of FIG. 6, on condition that the noise components in the two circuits are mutually equal. For example, if the emitter area ratio N of the current mirrors CM1 and CM11 is set to 2, it follows therefrom that the photodiode amplifier circuit of FIG. 6 has a better S/N improved twice in comparison with the circuit of FIG. 3.

Further comparing the photodiode amplifier circuit of the related art in FIG. 4 with the photodiode amplifier circuit of the present invention in FIG. 6, if the emitter area ratio N is set to 2 in the photodiode amplifier circuit of FIG. 6, it follows that, since the output voltage $v_0$ of the differential amplifier OP3 in the photodiode amplifier circuit of FIG. 4 conforms to Eq. (12), the S/N obtained in the circuit of FIG. 6 is rendered equal to that in the photodiode amplifier circuit of FIG. 3. And in case the emitter area ratio N is set to a value of N>2 in the circuit of FIG. 6, it becomes possible to easily achieve an improved S/N better than that in the circuit of FIG. 4.

In the circuit of FIG. 6 where any of DC blocking capacitors $C_3$, $C_4$, $C_{13}$ and $C_{14}$ need not be inserted unlike in the circuit of FIG. 4, it is possible to perform amplification of the DC component as well. In addition thereto, a resistor of any relatively great value need not be connected across each of the photodiodes PD1 and PD11 in the circuit of FIG. 6, whereby the circuit can be constructed into a single chip with facility.

Figure 10A:
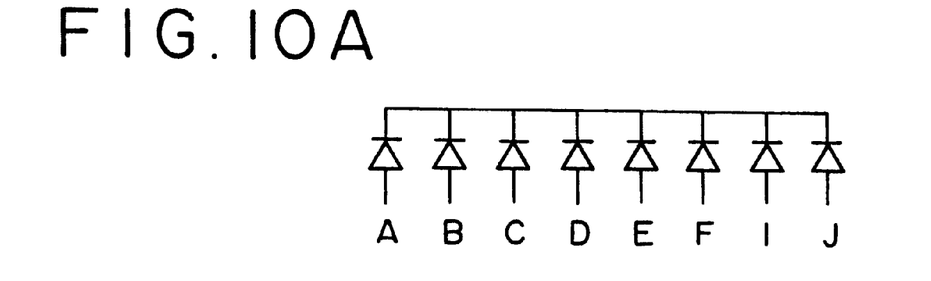
FIG. 10A shows a structure of a photo detector applicable to the converter of FIG. 6.
Figure 10B:
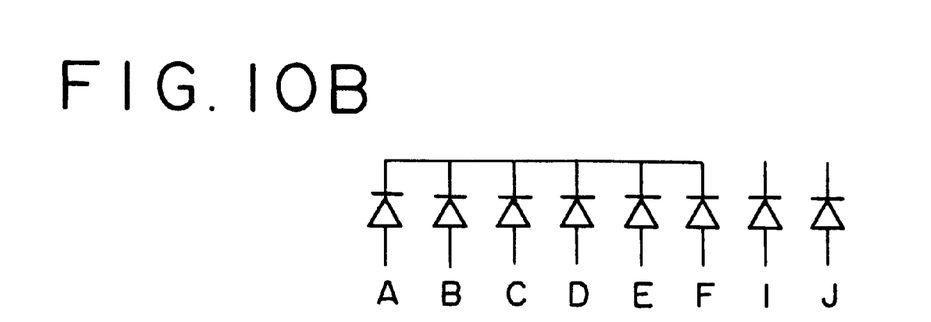
FIG. 10B shows a structure of a photo detector applicable to the converter of FIG. 4.

Supposing that the circuit of FIG. 4 is a differential detection circuit composed of photo detectors I and J, resistors $R_4$ and $R_{14}$ are inserted between the cathodes of the photodiodes PD1, PD11 and the power supply line +Vcc. Therefore, as shown conceptually in FIG. 10B, the anodes and cathodes of at least the two photodiodes (PD1, PD11), which constitute the photo detectors I and J out of the entire photo detectors A to J, need to be formed independently, hence necessitating special steps of manufacture relative to semiconductor.

However, in the circuit of FIG. 6 where no resistor is inserted between the cathode of each of the photodiodes PD1, PD11 and the power supply line +Vcc, at least the cathodes of the photo detectors A to J can be formed in common to consequently render the photo detectors formable through ordinary steps of manufacture.

Figure 7:
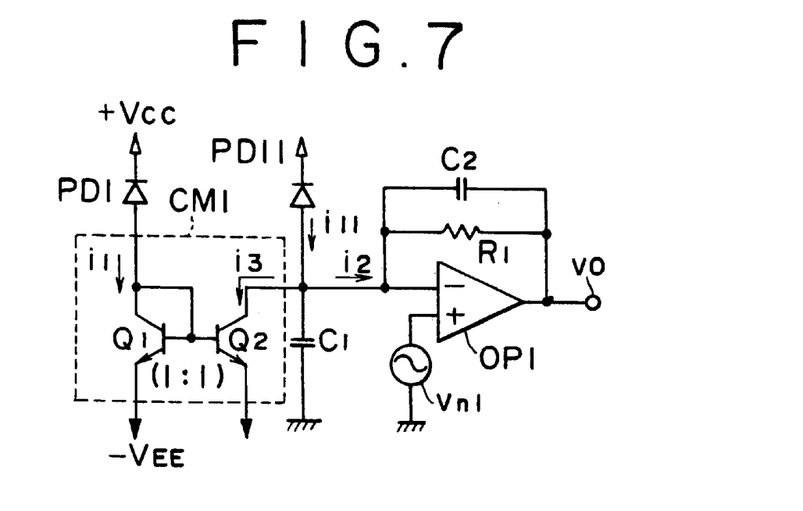
FIG. 7 shows a third embodiment of a current-voltage converter applicable to the invention to perform photoelectric conversion.

FIG. 7 is a circuit diagram showing the configuration of a third embodiment which represents a photodiode amplifier circuit of the invention. In this diagram, any circuit elements corresponding to those in FIG. 5 are denoted by like reference numerals or symbols, and a repeated explanation thereof is omitted.

The circuit shown in FIG. 7 is constituted by adding a photodiode PD11 to the configuration of FIG. 5. A cathode of this photodiode PD11 is connected to a power supply line +Vcc, while an anode thereof is connected to a junction of a collector of a transistor $Q_2$ and an inverting input of an operational amplifier OP1. In this case, the photodiodes PD1 and PD11 constitute photo detectors I and J of, e.g., FIG. 9, respectively.

In a current mirror CM1, the emitter area of the transistor $Q_2$ and that of the transistor $Q_1$ are set to a ratio of 1:1, i.e., N=1.

Accordingly, in response to the output current $i_1$ of the photodiode PD1, a collector current $i_3$ of the same level is caused to flow in the transistor $Q_2$. Assuming here that the output current $i_{11}$ of the photodiode PD11 is flowing now, the input current $i_2$ to the inverting input of the operational amplifier OP1 is expressed as $$i_2 = i_{11} - i_3 \quad (21)$$

Since the output current $i_1$ of the photodiode PD1 and the collector current $i_3$ of the transistor $Q_2$ are at the same level, the input current $i_2$ to the inverting input of the operational amplifier OP1 can be regarded as a differential detection output obtained with respect to the output currents of the two photodiodes PD1 and PD11.

And in a frequency range where the influences of stray capacitances $C_1$ and $C_2$ are merely slight, the output voltage $v_0$ of the operational amplifier OP1 in FIG. 7 is expressed as $$v_0 = -i_2 \cdot R_1 + v_{n1} \quad (22)$$

In this case also, the output currents $i_1$ and $i_{11}$ of photodiodes PD1 and PD11 can be simplified as given before in Eq. (19). Consequently, the output $v_0$ of the operational amplifier OP1 is expressed as $$v_0 = 2i \cdot R_1 v_{n1} \quad (23)$$

Comparing the output voltage $v_0$ (Eq. (23)) of the operational amplifier OP1 in the circuit of FIG. 3 with the output voltage $v_0$ (Eq. (6)) of the differential amplifier OP3 in the circuit of FIG. 3, it is found that the S/N is improved $2^{1/2}$ times in the circuit of this embodiment shown in FIG. 7.

Further in this embodiment, the same advantages as those mentioned above in the foregoing embodiments are also achievable inclusive of amplification of the DC component, a single chip structure, and common connection of cathodes.

Figure 8:
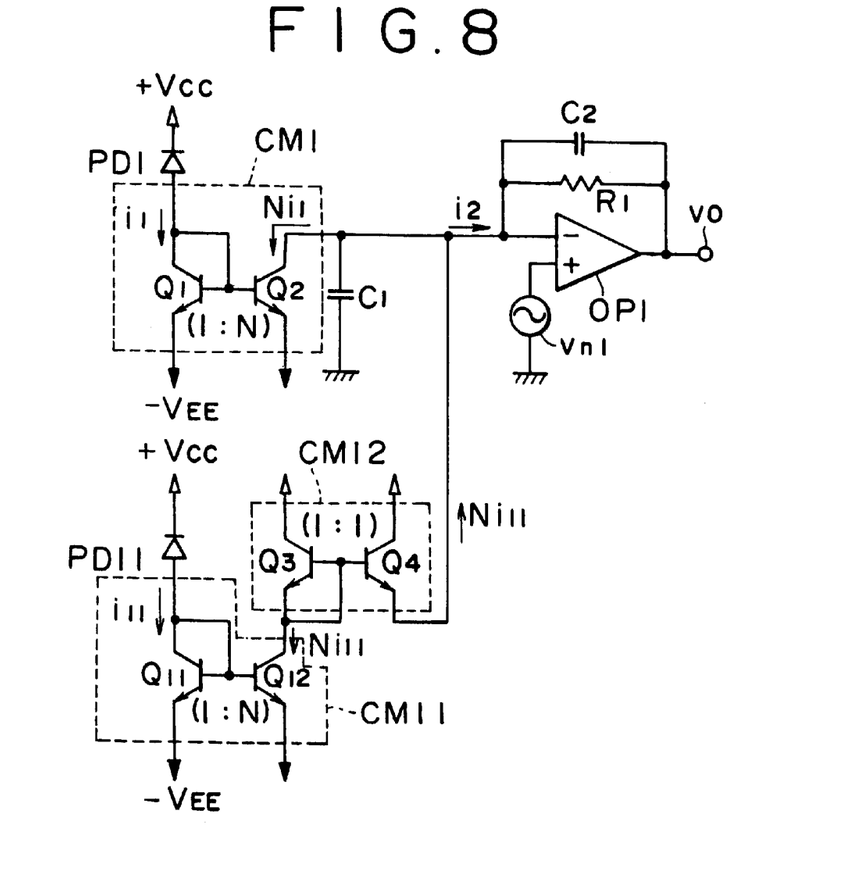
FIG. 8 shows a fourth embodiment of a current-voltage converter applicable to the invention to perform photoelectric conversion.

FIG. 8 is a circuit diagram showing the configuration of a fourth embodiment which represents a photodiode amplifier circuit of the invention. In this diagram, any circuit elements corresponding to those in FIGS. 5 to 7 are denoted by like reference numerals or symbols, and a repeated explanation thereof is omitted.

The circuit shown in FIG. 8 is constituted by adding a photodiode PD11, a current mirror CM11 (transistors $Q_{11}$, $Q_{12}$) and a current mirror CM12 (transistors $Q_3$, $Q_4$) to the configuration of FIG. 5. In this embodiment, the emitter area ratio (emitter area of transistor $Q_{11}$:emitter area of transistor $Q_{12}$) in the current mirror CM11 is set as 1:N similarly to the ratio (emitter area of transistor $Q_1$:emitter area of transistor $Q_2$) in the current mirror CM1. And the emitter area ratio (emitter area of transistor $Q_3$:emitter area of transistor $Q_4$) in the current mirror CM12 is set as 1:1.

In this case also, the photodiodes PD1 and PD11 are supposed to constitute photo detectors I and J shown in FIG. 9.

The circuit is so connected that the output current $i_{11}$ of the photodiode PD11 is inputted to the transistor $Q_{11}$, whereby a collector current amplified to the level of $Ni_{11}$ is caused to flow in the transistor $Q_{12}$. The collector current $Ni_{11}$ of the transistor $Q_{12}$ is inputted to the transistor $Q_3$, so that a collector current $Ni_{11}$, which is equal in level to the above current $Ni_{11}$ and flows in the direction indicated by an arrow in FIG. 8, is obtained from the transistor $Q_4$. In this case, the current mirror CM12 operates to transfer the current $Ni_{11}$ in reverse polarity with a current amplification factor 1. The output current $i_1$ of the photodiode PD1 is amplified N times by the current mirror CM1 to become a current $Ni_2$.

In this circuit configuration, the input current $i_2$ to the inverting input of the operational amplifier OP1 is expressed as $$i_2 = N(i_{11} - i_1) \quad (24)$$

In a frequency range where the influences of stray capacitances $C_1$ and $C_2$ are merely slight, the output voltage $v_0$ of the operational amplifier OP1 can be expressed as Eq. (22). And in this case also, the output currents $i_1$ and $i_{11}$ of the photodiodes PD1 and PD11 can be simplified as given by Eq. (19), so that the output voltage $v_0$ of the operational amplifier OP1 is expressed as $$v_0 = 2N \cdot i \cdot R_1 + n_{n1} \quad (25)$$

Therefore, comparing the output voltage $v_0$ (Eq. (25)) of the operational amplifier OP1 in the circuit of FIG. 8 with the output voltage $v_0$ (Eq. (6)) of the differential amplifier OP3 in the circuit of FIG. 3, the S/N can be improved $N \times 2^{1/2}$ times in the circuit of FIG. 8. Further comparing the output voltage $v_0$ obtained in the circuit of FIG. 8 with the output voltage $v_0$ (Eq. (12)) of the differential amplifier OP3 in the circuit of FIG. 4, it is possible to improve the S/N $2^{1/2}$ times, in comparison with the value in the circuit of FIG. 4, by setting the emitter area ratio as N=2, or to achieve more improvement of the S/N with facility by setting the emitter area ratio as N>2.

In this fourth embodiment also, the same advantages as those mentioned above in the foregoing embodiments are similarly achievable inclusive of amplification of the DC component, a single chip structure, and common connection of cathodes.

Figure 11A:
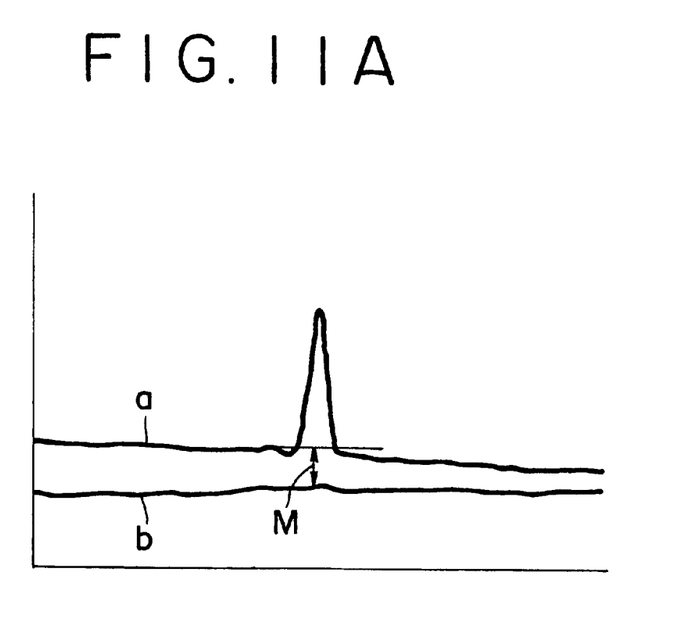
FIG. 11A graphically shows the characteristic of the photo detector amplifier represented by the second embodiment of the invention in FIG. 6.
Figure 11B:
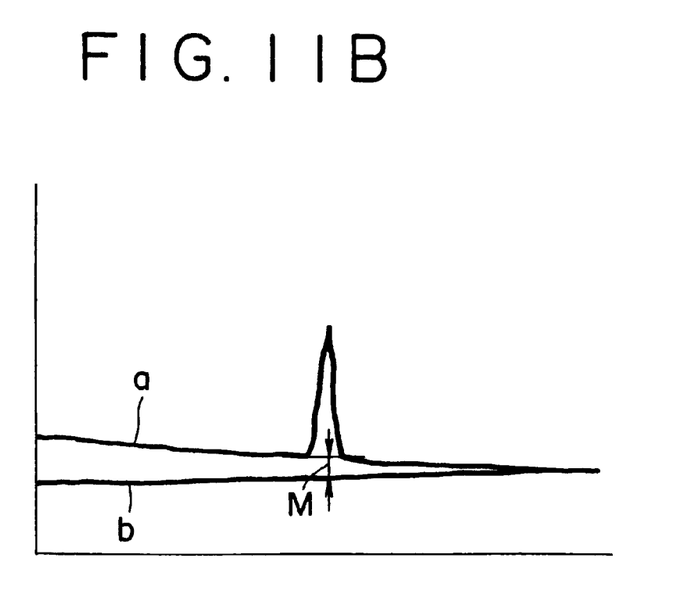
FIG. 11B graphically shows the characteristic of the photo detector amplifier represented by the example of the related art in FIG. 3.

FIGS. 11A and 11B graphically show the results of comparatively measuring the S/N characteristics in the photodiode amplifier circuit of this embodiment and that of the related art. Supposing that FIG. 11A corresponds to the characteristic of the photodiode amplifier circuit shown in FIG. 6 as the second embodiment, FIG. 11B corresponds to the characteristic of the photodiode amplifier circuit shown in FIG. 3 as a known example of the related art. Comparing the photodiode amplifier circuit of FIG. 6 with that of FIG. 3, it is obvious that, as seen from a comparison of Eq. (6) with Eq. (20), the signal component is increased N times on condition that the noise levels of the respective output voltages $v_0$ are mutually equal.

In each of FIGS. 11A and 11B, frequencies are taken along the abscissa, and levels are taken along the ordinate. Also in each of these graphs, a line a denotes a spectrum of the single carrier reproduced from a disk, and a line b denotes a spectrum of the noise component.

As obvious from the graphs, it is seen that the signal level in the embodiment is increased in contrast with the noise level, and the margin level M of the signal to the noise is more extended in the embodiment than in the related art.

In the above description regarding the current mirror employed in the embodiments, the current amplification factor is set by the emitter area ratio N of its transistors. However, in the current mirror CM1 for example, the current amplification factor may be set by parallel connection of a transistor $Q_2$ having the same emitter area as that of the transistor $Q_1$.

Also in the above description, the present invention is concerned with a photodiode amplifier circuit to amplify a received light signal of a photodiode which constitutes a photo detector employed in a reproducing apparatus for a magneto-optical disk or the like. However, the present invention is not limited thereto alone, and may further be applied as an amplifier circuit relative to a photo detector to be used in a reproducing apparatus for some other disk-shaped recording medium, or as a photodiode amplifier circuit to be used for some other purpose than a photo detector in a reproducing apparatus for a disk-shaped recording medium.

Thus, according to the present invention, a current mirror is inserted in a photodiode amplifier circuit for example to obtain a desired gain relative to the output current of the photodiode or to obtain a differential output of plural photodiodes, so that the S/N in the output of the photodiode amplifier circuit can be improved without the necessity of increasing the value of the resistor connected to an operational amplifier for example. Consequently, it becomes possible to easily ensure a required band width with respect to the signal output of the photodiode amplifier circuit.

In case the configuration of the differential amplifier circuit is such that, as in the related art, the S/N is improved by extracting and using the opposite-phase light signal from one photodiode, a resistor needs to be connected across the photodiode, and the received light signal needs to be extracted via a DC blocking capacitor, whereby amplification of the DC signal component is rendered impossible. However, according to the present invention, such resistor and DC blocking capacitor are no longer necessary to consequently realize amplification of the DC signal component as well.

Further, due to the non-necessity of such resistor and DC blocking capacitor of relatively great values, the circuit elements other than the photodiodes or the entire amplifier circuit including the photodiodes can be constructed into a single chip to eventually realize dimensional reduction of the photodiode amplifier circuit.

In addition, when the photodiodes in the amplifier circuit of the present invention serve as photo detectors in a disk apparatus, at least the cathodes of the photodiodes are formable to be common, whereby the ordinary semiconductor manufacturing process is sufficient to meet the requirement.

Although the present invention has been described hereinabove with reference to some preferred embodiments thereof, it is to be understood that the invention is not limited to such embodiments alone, and a variety of other changes and modifications will be apparent to those skilled in the art without departing from the spirit of the invention.

The scope of the invention, therefore, is to be determined solely by the appended claims.

What is claimed is:

1. A photo detector circuit comprising:
   a photodiode for detecting a reflected light beam from an optical recording medium and converting the light beam into a current output; and current-voltage converter means for converting the output current of said photodiode into a proportional voltage;

wherein the output current of said photodiode is inputted via a current mirror circuit to said current-voltage converter means.

2. The photo detector circuit according to claim 1, wherein said current mirror circuit amplifies and transfers the output current of said photodiode.

3. The photo detector circuit according to claim 1, wherein two or more photodiodes are provided, and current mirror circuits are provided correspondingly to the output currents of the relevant photodiodes.

4. The photo detector circuit according to claim 3, wherein two or more photodiodes are provided, and current-voltage converter means are provided correspondingly to said current mirror circuits supplied with the output currents of the relevant photodiodes respectively.

5. The photo detector circuit according to claim 3, wherein two or more photodiodes are provided, and a single current-voltage converter means is provided to receive the output of each current mirror circuit supplied with the output current of each photodiode.

6. The photo detector circuit according to claim 3, wherein said current mirror circuit consists of multi-stage current mirrors.

7. The photo detector circuit according to claim 1, wherein said photodiode consists of first and second photodiodes, and the output current of said second photodiode is injected to the current mirror circuit supplied with the output current of said first photodiode, the current-voltage converter means for converting the output current of said current mirror circuit to a proportional voltage, and also to the junction of said current-voltage converter means and said current mirror circuit.

* * * * *